United States Patent
Oohiraki et al.

(10) Patent No.: US 11,315,868 B2
(45) Date of Patent: Apr. 26, 2022

(54) ELECTRONIC-COMPONENT-MOUNTED MODULE DESIGN TO REDUCE LINEAR EXPANSION COEFFICIENT MISMATCHES

(71) Applicant: MITSUBISHI MATERIALS CORPORATION, Tokyo (JP)

(72) Inventors: Tomoya Oohiraki, Saitama (JP); Sotaro Oi, Suntogun (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/982,732

(22) PCT Filed: Mar. 23, 2018

(86) PCT No.: PCT/JP2018/011688
§ 371 (c)(1),
(2) Date: Sep. 21, 2020

(87) PCT Pub. No.: WO2019/180914
PCT Pub. Date: Sep. 26, 2019

(65) Prior Publication Data
US 2021/0005544 A1    Jan. 7, 2021

(51) Int. Cl.
*H01L 23/50* (2006.01)
*H01L 23/34* (2006.01)
(Continued)

(52) U.S. Cl.
CPC ............ *H01L 23/50* (2013.01); *H01L 23/345* (2013.01); *H01L 23/3735* (2013.01);
(Continued)

(58) Field of Classification Search
CPC ...................................................... H01L 23/50
(Continued)

(56) References Cited

U.S. PATENT DOCUMENTS 5,015,803 A    5/1991 Mahulikar et al.
6,310,775 B1   10/2001 Nagatomo et al.
(Continued)

FOREIGN PATENT DOCUMENTS

JP    2001-291823 A    10/2001
JP    2002-094210 A     3/2002
(Continued)

OTHER PUBLICATIONS

Office Action dated Oct. 6, 2020, issued for Japanese Patent Application No. 2017-005684.
(Continued)

*Primary Examiner* — Ajay Arora
(74) *Attorney, Agent, or Firm* — Locke Lord LLP; James E. Armstrong, IV; Nicholas J. DiCeglie, Jr.

(57) ABSTRACT

An electronic-component-mounted module has an electronic component, a first silver-sintered bonding layer bonded on one surface of the electronic component, a circuit layer made of copper or copper alloy and bonded on the first silver-sintered bonding layer, and a ceramic substrate board bonded on the circuit layer, and further has an insulation circuit substrate board with smaller linear expansion coefficient than the electronic component, a second silver-sintered bonding layer bonded on the other surface of the electronic component, and a lead frame with smaller linear expansion coefficient than the electronic component bonded on the second silver-sintered bonding layer; and a difference in the linear expansion coefficient between the insulation circuit substrate board and the lead frame is not more than 5 ppm/° C.

6 Claims, 4 Drawing Sheets

(51) Int. Cl.
*H01L 23/373* (2006.01)
*H01L 23/495* (2006.01)
*H05K 1/03* (2006.01)

(52) U.S. Cl.
CPC ..... *H01L 23/49582* (2013.01); *H05K 1/0306* (2013.01); *H05K 2201/068* (2013.01)

(58) Field of Classification Search
USPC ........................................................ 257/666
See application file for complete search history.

(56) References Cited

U.S. PATENT DOCUMENTS

| | | |
|---|---|---|
| 2002/0034059 A1 | 3/2002 | Kijima et al. |
| 2004/0065947 A1 | 4/2004 | Sugiyama et al. |
| 2006/0022326 A1 | 2/2006 | Morita et al. |
| 2007/0125449 A1 | 6/2007 | Kajiwara et al. |
| 2009/0194868 A1* | 8/2009 | Chong .................. H01L 21/568 257/712 |
| 2014/0191399 A1* | 7/2014 | Ando ...................... H01L 24/34 257/746 |
| 2014/0252578 A1 | 9/2014 | Berlin et al. |
| 2016/0268190 A1 | 9/2016 | Mcknight-Macneil et al. |
| 2017/0064808 A1 | 3/2017 | Rizza et al. |
| 2019/0189537 A1 | 6/2019 | Fujino et al. |

FOREIGN PATENT DOCUMENTS

| | | |
|---|---|---|
| JP | 2004-128264 A | 4/2004 |
| JP | 2005-328087 A | 11/2005 |
| JP | 2006-041362 A | 2/2006 |
| JP | 2007-152385 A | 6/2007 |
| JP | 2013-077666 A | 4/2013 |
| JP | 2014-003339 A | 1/2014 |
| JP | 2018-6492 A | 1/2018 |
| WO | 2018/021322 A1 | 2/2018 |

OTHER PUBLICATIONS

Search Report issued for the Office Action dated Apr. 28, 2021 of Taiwan Patent Application No. 107110649.
International Search Report dated May 15, 2018, issued for PCT/JP2018/011688.
Chen et al., "On the Effective Coefficient of Thermal Expansion (CTE) of Bilayer/Trilayer in Semiconductor Package Substrates", 2015 Electronic Components & Technology Conference, 1932-1937.
Office Action issued in European Patent Application No. EP 18911287.3, dated Jan. 13, 2022.

* cited by examiner

ELECTRONIC-COMPONENT-MOUNTED MODULE DESIGN TO REDUCE LINEAR EXPANSION COEFFICIENT MISMATCHES

BACKGROUND OF THE INVENTION

Technical Field

The present invention relates to an electronic-component-mounted module on which power components, LED components, thermoelectric components, and the other electronic components are mounted.

Background Art

Among electronic-component-mounted module, power modules used for semiconductor device controlling large electric current and high voltage are required to deal with large electric current capacity and reduce wiring resistance. In Patent Document 1 for example employs a structure in which wiring connected to semiconductor components are formed from lead frames made of copper; and electronic components (power components and controlling semiconductor components) and the connection parts of the lead frames (an external lead frame and an internal lead frame) are resin-sealed by epoxy resin and the like.

For the electronic-component-mounted modules, as shown in Patent Document 2 for example, an insulation circuit substrate board (a power module substrate) in which a circuit layer made of an aluminum board or the like is bonded on one surface of an insulation substrate board such as aluminum nitride and a metal layer made of an aluminum board or the like is bonded on the other surface is used. The metal layer of this insulation circuit substrate board is bonded on a heat sink made of copper or the like.

In a case in which the electronic component and the lead frame are bonded on this insulation circuit substrate board to form the electronic-component-mounted module, for example, on the circuit layer of the insulation circuit substrate board in which the circuit layer and the metal layer are bonded on surfaces of the insulation substrate board, the electronic component is bonded by methods such as silver-sintering, soldering, or the like. After that, the lead frame made of copper is bonded on this electronic component by soldering or the like.

CITATION LIST

Patent Document

Patent Document 1: Japanese Unexamined Patent Application, First Publication No. 2001-291823
Patent Document 2: Japanese Unexamined Patent Application, First Publication No. 2005-328087

SUMMARY OF INVENTION

Technical Problem

In the above-described electronic-component-mounted module, aluminum, aluminum alloy, copper, and copper alloy used for the circuit layer and the lead frame have larger linear expansion coefficient than that of the electronic component. Therefore, in a case in which the electronic component and the lead frame are mounted on the circuit layer by soldering, owing to change in usage environment and resistance heat of the electronic component and the like, thermal stress is generated in solder bonding layers between the electronic component or the lead frame and the circuit layer repeatedly, cracks may be generated in the solder bonding layer. In a case in which silver-sinter bonding substitutes soldering for mounting the electronic component and the lead frame, the silver-sintered bonding layer has higher bonding reliability in high temperature environment than the solder bonding layer and good thermal transference. However, the silver-sintered bonding layer is thinner and harder than the solder bonding layer; so large thermal stress acts on the electronic component itself and the electronic component may be broken.

The present invention is achieved in consideration of the above circumstances, and has an object of provide an electronic-component-mounted module which can prevent the breakage of the electronic component with improving the bonding reliability of the circuit layer, the electronic component, and the lead frame by the silver-sintered bonding layer.

Solution to Problem

Electronic-component-mounted module of the present invention includes: an electronic component; a first silver-sintered bonding layer bonded on one surface of the electronic component; an insulation circuit substrate board including a circuit layer made of copper or copper alloy bonded on the first silver-sintered bonding layer and a ceramic substrate board bonded on the circuit layer, and having a smaller linear expansion coefficient than the electronic component; a second silver-sintered bonding layer bonded on the other surface of the electronic component; and a lead frame bonded on the second silver-sintered bonding layer and having a smaller linear expansion coefficient than the electronic component; and a difference in the linear expansion coefficient between the insulation circuit substrate board and the lead frame is not more than 5 ppm/° C.

The electronic-component-mounted module has high bonding reliability even in high temperature environment because the insulation circuit substrate board and the lead frame have lower linear expansion coefficient than the electronic component and both the surfaces of the electronic component are bonded on the insulation circuit substrate board and the lead frame with the silver-sintered bonding layers (the first silver-sintered bonding layer and the second silver-sintered bonding layer) therebetween. Heat generated in the electronic component can be quickly released since thermal conductivity of the silver-sintered bonding layers is excellent. Moreover, thermal stress in the electronic component is reduced and the breakage thereof can be prevented since members bonded on both the surfaces of the electronic component have smaller linear expansion coefficient than the electronic component so as to decrease the difference in the linear expansion to the electronic component. In this case, it is not desirable that the difference in the linear expansion coefficient between the insulation circuit substrate board and the lead frame is more than 5 ppm/° C. because the thermal stress in the electronic component is large by the difference in the linear expansion.

As a preferred aspect of the electronic-component-mounted module of the present invention, it is preferable that a thickness of the circuit layer is t1; and a thickness of the lead frame is t2; and a thickness ratio (t1/t2) of the thickness t1 and the thickness t2 be not less than 0.2 and not more than 5.0. It is preferable that the lead frame be made of copper-type low linear-expansion material including a composite material which is a combination of copper and low linear-expansion material such as tungsten, molybdenum, chrome, or the like; and copper boards bonded on both surfaces of the composite material. It is preferable that the electronic-component-mounted module further have molding resin sealing the insulation circuit substrate board, the electronic component, and the lead frame integrally.

Although copper or copper alloy has larger linear expansion coefficient comparing with the electronic component, since the circuit layer made of copper or copper alloy is bonded on the ceramic substrate board in a laminated state, the linear expansion of the insulation circuit substrate board is influenced by the linear expansion of the ceramic substrate board. Accordingly, the insulation circuit substrate board itself is lower in the linear expansion than the electronic component. In this case, if the thickness ratio (t1/t2) of the thickness t1 of the circuit layer and the thickness t2 of the lead frame is less than 0.2 or more than 5.0, an effect of arranging the insulation circuit substrate board and the lead frame made of the low linear-expansion material on both the surfaces of the electronic component to balance is deteriorated. As a result, the linear expansion of thicker one of the circuit layer or the lead frame dominant, and breakages of the electronic component may occur.

An electronic-component-mounted module of the present invention has: an electronic component; a first silver-sintered bonding layer bonded on one surface of the electronic component; an insulation circuit substrate board having: a spacing member with smaller linear expansion coefficient than the electronic component bonded on the first silver-sintered bonding layer, a third silver-sintered bonding layer bonded on the spacing member, a circuit layer made of aluminum or aluminum alloy and bonded on the third silver-sintered bonding layer, and a ceramic substrate board bonded on the circuit layer; a second silver-sintered bonding layer bonded on the other surface of the electronic component; and a lead frame bonded on the second silver-sintered bonding layer and having smaller linear-expansion coefficient than the electronic component, wherein a difference in the linear expansion coefficient to the spacing member is not more than 5 ppm/° C.

As a preferred aspect of an electronic-component-mounted module of the present invention, it is preferable that a thickness of the spacing member is t3, a thickness of the lead frame is t2, and a thickness ratio (t3/t2) of the thickness t1 and the thickness t2 be not less than 0.2 and not more than 5.0. It is preferable that the spacing member and the lead frame be made of copper-type low linear-expansion material, having a composite material which is a combination of copper and low linear-expansion material such as tungsten, molybdenum, chrome, or the other low linear-expansion material, and copper boards bonded on both surfaces of the composite material. It is preferable that the electronic-component-mounted module further have molding resin sealing the insulation circuit substrate board, the electronic component, and the lead frame integrally.

The spacing member can adjust a height position (a position in a lamination direction) of the lead frame, and the lead frame can be drawn out from an appropriate position. Also in this case, the thickness ratio (t3/t2) of the spacing member and the lead frame is set to be not less than 0.2 and not more than 5.0 not to break the electronic component.

Advantageous Effects of Invention

According to the electronic-component-mounted module of the present invention, by bonding the low linear-expansion material with smaller linear expansion coefficient than that of the electronic component on both the surfaces of the electronic component by the silver-sintered bonding layers, so that the difference in the linear expansion between the low linear-expansion material at both sides is small, it is possible to improve the bonding reliability and the thermal transference and it is possible to reduce the thermal stress in the electronic component and prevent it's breakage.

DESCRIPTION OF EMBODIMENTS

Hereinafter, embodiments of the present invention will be explained referring to drawings.

1. First Embodiment

———Whole Structure———

Figure 1:
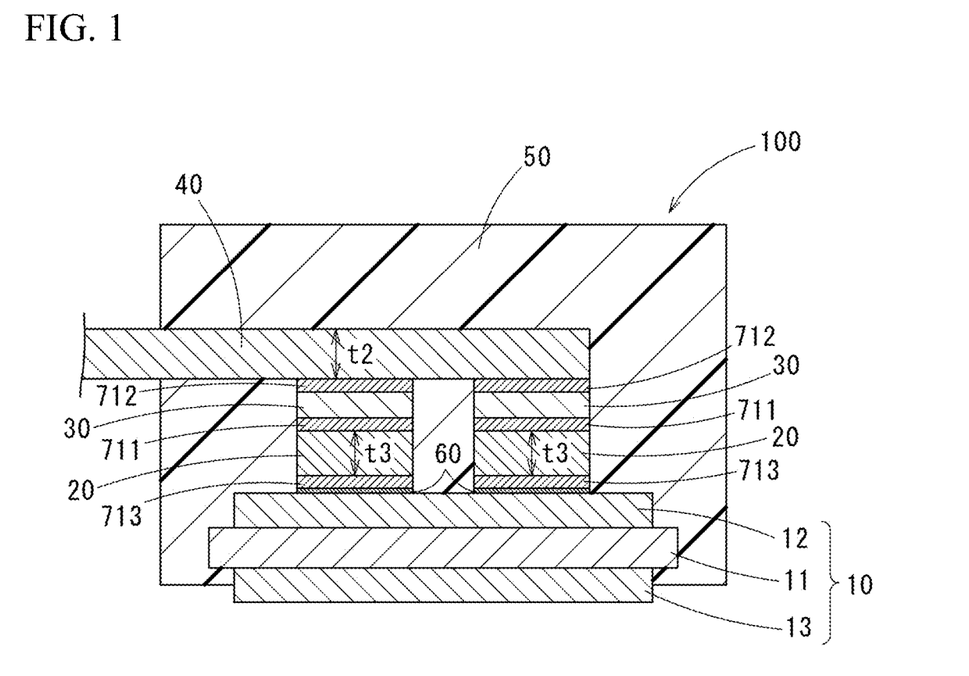
FIG. 1 It is a sectional view of a power module of a first embodiment of the present invention.

A first embodiment explains an example of applying an electronic-component-mounted module for a power module 100. The power module 100 is provided with semiconductor components (electronic components of the present invention) 30; first silver-sintered bonding layer 711 bonded on one surface of the electronic components 30; a power module substrate (an insulation circuit substrate board of the present invention) 10 bonded on the first silver-sintered bonding layers 711; second silver-sintered bonding layers 712 bonded on the other surface of the semiconductor components 30; a lead frame 40 bonded on the second silver-sintered bonding layers 712; and a molding resin 50 sealing these semiconductor components 30, the power module substrate 10, and the lead frame 40, as shown in FIG. 1.

The power module substrate 10 has spacing members 20 bonded on the first silver-sintered bonding layers 711; third silver-sintered bonding layers 713 bonded on the spacing members 20; a circuit layer 12 bonded on the third silver-sintered bonding layers 713; and a ceramic substrate board 11 bonded on the circuit layer 12. The other surfaces of the semiconductor components 30 are mounted on a surface of 12 of the power module substrate 10 with the third silver-sintered bonding layers 713, the spacing members 20, and the first silver-sintered bonding layers 711 therebetween. The lead frame 40 is bonded on the other surface of the semiconductor components 30 with the second silver-sintered bonding layers 712 therebetween.

For the ceramic substrate board 11 forming the power module substrate 10, nitride-type ceramics such as MN (aluminum nitride), $Si_3N_4$ (silicon nitride) and the like, or oxide-type ceramics such as $Al_2O_3$(alumina) and the like can be used, for example. A thickness of the ceramic substrate board 11 is in a range of 0.2 mm to 1.5 mm.

The circuit layer 12 and a heat radiation layer 13 are made of aluminum with purity 99.00% by mass or higher (so-called 2N aluminum), aluminum with purity 99.99% by mass or higher (so-called 4N aluminum), or aluminum alloy. Thickness of the circuit layer 12 and the heat radiation layer 13 are 0.1 mm to 5.0 mm for example. The circuit layer 12 and the heat radiation layer 13 are normally formed into a flat rectangular shape smaller than the ceramic substrate board 11. The circuit layer 12 and the heat radiation layer 13 are bonded on the ceramic substrate board 11 by brazing material of alloy such as Al—Si type, Al—Ge type, Al—Cu type, Al—Mg type, or Al—Mn type. The circuit layer 12 and the heat radiation layer 13 are formed into a desired shape by any of: punching to have the desired outline by press machining and bonding it on the ceramic substrate board 11; or bonding a flat piece on the ceramic substrate board 11 and then forming into the desired outline by etching.

The spacing members 20 are made of material having lower linear expansion than the linear expansion coefficient of the semiconductor components 30: e.g., copper-type low linear-expansion material, having a composite material in which copper (Cu) having high thermal conductivity is combined with tungsten (W), molybdenum (Mo), chrome (Cr) or the other low linear expansion coefficient material together; and copper boards bonded on both surfaces of the composite materials. A thickness t3 of the spacing members 20 is preferably in a range of 0.5 mm to 6.0 mm. For the spacing members 20, for example, a clad board in which pure copper boards with a thickness 0.1 mm to 2.0 mm are bonded on both surfaces of a composite material with a thickness 0.3 mm to 5.0 mm can be used. A composite material of Cu—Mo is appropriately used as the composite material; in this case, it is preferable to contain Mo in a range of 55% by mass to 75% by mass. The composite material of Cu—Mo is formed by forming mixed powder in which Cu powder and Mo powder are mixed and sintering it.

The copper-type low linear-expansion material can be adjusted in the linear expansion coefficient and thermal conductivity by changing content ratio of the low linear-expansion material and a ratio of a thickness to the cladded copper board. The linear expansion coefficient of the copper-type low linear-expansion material will be described later. The thermal conductivity of the copper-type low linear-expansion material is 180 to 200 W/m·K for example.

In FIG. 1, the two spacing members 20 are bonded on the circuit layer 12 aligning in a surface direction.

The semiconductor components 30 are electronic components provided with semiconductor. For the semiconductor components 30, various semiconductor components are selected, such as IGBT (Insulated Gate Bipolar Transistor), MOSFET (Metal Oxide Semiconductor Field Effect Transistor), FWD (Free Wheeling Diode), and the like according to necessary functions. On a top surface and a bottom surface of the semiconductor components 30, electrodes are provided and electrically connected between the circuit layer 12 and the lead frame 40. In this case, the semiconductor components 30 are respectively bonded on the two spacing members 20 and connected to each other by the lead frame 40.

The lead frame 40 is made of the lower linear expansion material than the linear expansion coefficient of the semiconductor components 30. The lead frame 40 is made of copper-type low linear-expansion material as that of the spacing members 20 for example and formed into a belt-sheet shape. A difference in the linear expansion coefficient between the lead frame 40 and the spacing members 20 is 5 ppm/° C. or less. As mentioned above, the copper-type low linear-expansion material can be adjusted in the linear expansion coefficient and the like in proportion to the content ratio of copper and the low linear-expansion material in the composite material and the thickness ratio of the cladded copper board. Linear expansion coefficient of the semiconductor components 30 is 20 ppm/° C. to 30 ppm/° C. for example. It is good that a thickness t2 of the lead frame 40 is in a range of not less than 0.05 mm and not more than 3.0 mm. A thickness ratio (t3/t2) of the thickness t3 of the spacing members 20 and the thickness t2 of the lead frame 40 is set to not less than 0.2 and not more than 5.0 in order to effectively show an effect of reduction in the difference of the linear expansion coefficient between them.

The spacing members 20, the semiconductor components 30, the lead frame 40 are bonded on the circuit layer 12 of the power module substrate 10 respectively with the silver-sintered bonding layers 711 to 713 therebetween. In the present embodiment, the silver-sintered bonding layers 711 to 713 are distinguished as follows: the silver-sintered bonding layers bonding the semiconductor components 30 and the spacing members 20 are the first silver-sintered bonding layers 711; the silver-sintered bonding layers bonding the semiconductor components 30 and the lead frame 40 are the second silver-sintered bonding layers 712; and the silver-sintered bonding layers bonding the spacing members 20 and the circuit layer 12 are the third silver-sintered bonding layers 713.

In order to bond the spacing members 20 by the third silver-sintered bonding layers 713, undercoat metal layers 60 made of gold (Au), Silver (Ag), nickel (Ni) or the like is formed on a bonding surface of the circuit layer 12. While the illustration is omitted, the undercoat metal layers made of gold, silver, nickel, and the like may be formed by plating, spattering or the like on the respective bonding surfaces of the spacing members 20, the semiconductor components 30, and the lead frame 40.

The molding resin 50 is made of epoxy resin and the like. The molding resin 50 seals the heat radiation layer 13 at side surfaces, the ceramic substrate board 11, the circuit layer 12, the spacing members 20, the semiconductor components 30, and the lead frame 40 at the vicinity of a connecting part to the semiconductor components 30 integrally except for a bottom surface of the heat radiation layer 13 of the power module substrate 10. An end part of the lead frame 40 is drawn out from the molding resin 50.

Manufacturing Method of First Embodiment

Next, a method of manufacturing the power module 100 structured as above will be explained.

Figure 2:
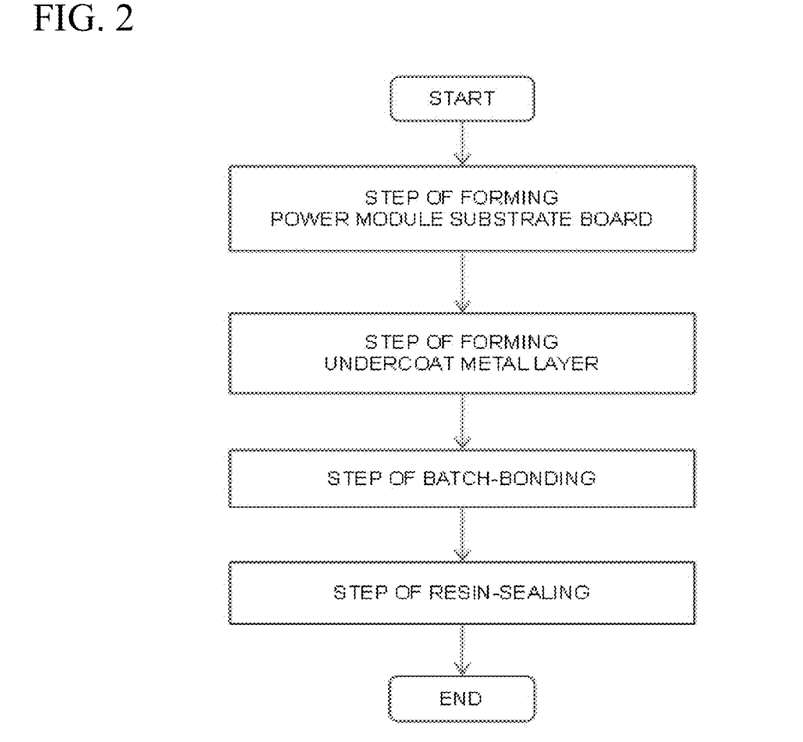
FIG. 2 It is a flow chart showing a method of manufacturing the power module in FIG. 1.

In this method the power module is formed by, as shown in FIG. 2, [a step of forming a power module substrate] forming the power module substrate 10; [a step of forming an undercoat metal layer] forming the undercoat metal layers 60 on a planned-bonding surface of the circuit layer 12 of the power module substrate 10; [a step of batch-bonding] laminating the spacing members 20, the semiconductor components 30, and the lead frame 40 on the circuit layer 12 in order and bonding at one time; and then [a step of resin-sealing] resin-sealing by the molding resin 50. Below, it will be explained in order of the process.

——Step of Forming Power Module Substrate——

Figure 3A:
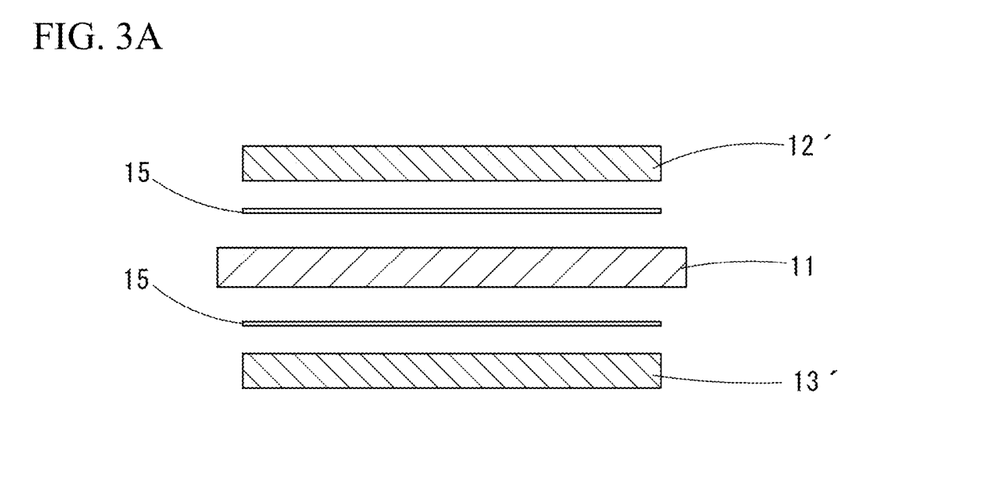
FIG. 3A It is a sectional view explaining a step of forming a power module substrate in the manufacturing method in FIG. 2.
Figure 3B:
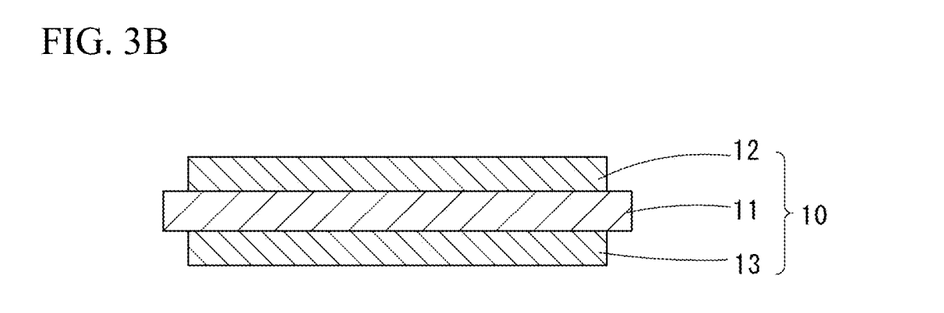
FIG. 3B It is a sectional view of the power module substrate

As shown in FIG. 3A, an aluminum board 12' which will be the circuit layer 12 and an aluminum board 13' which will be the heat radiation layer 13 are stacked on the surfaces of the ceramic substrate board 11 with soldering material 15 therebetween. A laminate structure body of these is heated in a state of pressed in a stacking direction so as to melt the brazing material 15; and the respective aluminum boards 12' and 13' are bonded to the ceramic substrate board 11, so that the power module substrate 10 having the circuit layer 12 and the heat radiation layer 13 is formed (refer to FIG. 3B). Specifically, the laminate structure body is put in a furnace with it remain pressed, and heated at temperature 610° C. to 650° C. inclusive for 1 minute to 60 minutes in vacuum atmosphere.

——Step of Forming Undercoat Metal Layer——

Before the step of batch-bonding, the undercoat metal layers 60 made of gold, silver, nickel, or the like are formed on the planned-bonding surface of the circuit layer 12. The undercoat metal layers 60 can be obtained by forming into a thin film shape by plating or spattering of gold, silver, nickel, or the like. The undercoat metal layers 60 also can be formed of glass-contained silver paste by applying on the surface of the circuit layer 12 and sintering them.

(Method of Forming Undercoat Metal Layer with Glass-Contained Silver Paste)

A method of forming the undercoat metal layers 60 with the glass-contained silver paste on the surface of the circuit layer 12 will be explained. The glass-contained silver paste contains silver powder, glass (lead-free glass) powder, resin, solvent, and dispersing agent; a content of powder component consisting of the silver powder and the glass powder is 60% by mass to 90% by mass inclusive to the whole glass-contained silver paste, and the remaining is the resin, the solvent, and the dispersing agent. A particle size of the silver powder is 0.05 μm to 1.0 μm inclusive; for example, an average particle size 0.8 μm is appropriate. The glass powder contains one or two or more of bismuth oxide ($Bi_2O_3$), zinc oxide (ZnO), boron oxide ($B_2O_3$), lead oxide ($PbO_2$), and phosphorus oxide ($P_2O_5$); and glass transition temperature thereof is 300° C. to 450° C. inclusive; softening temperature is not more than 600° C.; and crystallization temperature is not less than 450° C. For example, the glass powder with the average particle size 0.5 μm containing lead oxide, zinc oxide and boron oxide is appropriate.

A weight ratio A/G of a weight A of the silver powder and a weight G of the glass powder is adjusted in a range between 80/20 and 99/1, e.g., A/G=80/5. The solvent is appropriate to have a boiling point of 200° C. or higher, e.g., diethylene glycol dibutyl ether is used. The resin adjusts a viscosity of the glass-contained silver paste; it is appropriate to be decomposed at 350° C. or higher. For example, ethyl cellulose is used. Moreover, the dispersing agent of dicarboxylic acid type is suitably added. The glass-contained silver paste may be composed without the dispersing agent.

This glass-contained silver paste is manufactured by pre-mixing mixed powder of the silver powder and the glass powder and an organic mixed compound of the solvent and the resin with the dispersing agent in a mixer to obtain a pre-mixed compound; kneading the pre-mixed compound in a rolling-mill device to obtain a kneaded object; and filtering the kneaded object by a paste filtering device. This glass-contained silver paste is adjusted to have the viscosity of 10 Pa·s to 500 Pa·s inclusive, more preferably, 50 Pa·s to 300 Pa·s inclusive.

Figure 4:
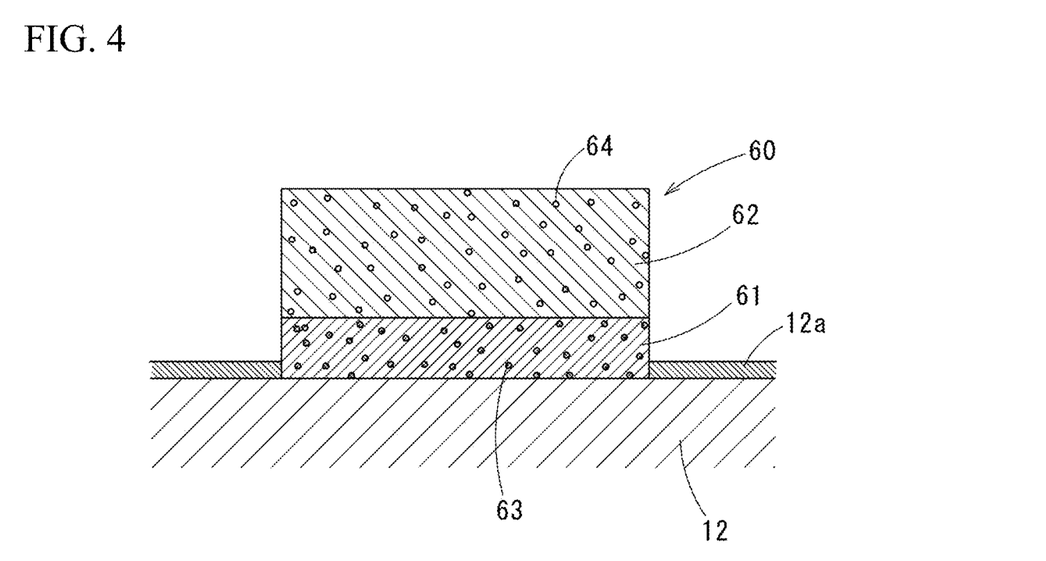
FIG. 4 It is an enlarged sectional view explaining an undercoat metal layer.

This glass-contained silver paste is applied on the planned-bonding surface of the circuit layer 12 by screen printing or the like; and after drying, it is burned at temperature of 350° C. to 645° C. inclusive for 1 minute to 60 minutes inclusive. As a result, as shown in FIG. 4, the undercoat metal layers 60 are formed to have a double structure of a glass layer 61 formed on the planned-bonding surface side and a silver layer 62 formed on this glass layer 61. While the glass layer 61 is formed, an aluminum oxide film 12*a* naturally generated on the surface of the circuit layer 12 is melted and removed, so that the glass layer 61 is directly formed on the circuit layer 12; and the silver layer 62 is formed on this glass layer 61. The silver layer 62 is certainly held and fixed on the circuit layer 12, by the glass layer 61 firmly adhered on the circuit layer 12.

In the glass layer 61, conductive particles (crystalline particles) 63 containing at least one of silver or aluminum are dispersed. It is inferred that the conductive particles 63 deposited inside the glass layer 61 while burning. Also inside the silver layer 62, minute glass particles 64 are dispersed. It is inferred that the glass particles 64 are coagulated objects of glass component remained in process of burning silver particles.

An average crystalline size of the silver layer 62 in the undercoat metal layers 60 formed as above is adjusted in a range of 0.5 μm to 3.0 μm inclusive. Here, in a case in which the heating temperature while burning the undercoat metal layers 60 is lower than 350° C. and the holding time at the heating temperature is less than one minute, the undercoat metal layers 60 cannot sufficiently formed. In contrast, in a case in which the heating temperature is higher than 645° C. and in a case in which the holding time at the heating temperature is more than 60 minutes, it is excessively burned, so that there is concern that the average crystalline size of the silver layer 62 in the undercoat metal layers 60 formed after the heat treatment be not in the range of 0.5 μm to 3.0 μm.

In order to reliably form the undercoat metal layers 60, it is preferable that a lower limit of the heating temperature in the heat treatment be 400° C. or higher, more preferably, 450° C. or higher. It is preferable that the holding time at the heating temperature be five minutes or longer, more preferably, 10 minutes or longer. In contrast, in order to reliably suppress the progress of burning, it is preferable that the heating temperature in the heating treatment be 600° C. or lower, more preferably, 575° C. or lower. It is preferable that the holding time at the heating temperature be 45 minutes or shorter, more preferably, 30 minutes or shorter.

(Silver Paste Layers)

Next, the circuit layer 12 on which the undercoat metal layers 60 are formed, the spacing members 20, the semiconductor components 30, and the lead frame 40 are laminated with interposing silver paste layers 70 therebetween.

The silver paste layers 70 are layers formed by applying silver paste containing silver powder of a particle size 0.05 μm to 100 μm inclusive, resin, and solvent. The resin for the silver paste is ethyl cellulose or the like. The solvent for the silver paste is α-terpineol or the like. It is preferable for composition of the silver paste that content of the silver powder be 60% by mass to 92% by mass inclusive to the whole silver paste, content of the resin be 1% by mass to 10% by mass inclusive to the whole silver paste, and the remaining be solvent.

The silver paste can contain organic metal compound powder of carboxylic acid type metal salt and the like such as silver formate, silver acetate, silver propionate, silver benzoate, silver oxalate and the like with not less than 0% by mass and not more than 10% by mass to the whole silver paste. Reducing agent such as alcohol, organic metal acid or the like can be contained also as necessary, with not less than 0% by mass and not more than 10% by mass to the whole silver paste. This silver paste is adjusted to have a viscosity 10 Pa·s to 100 Pa·s inclusive, more preferably, 30 Pa·s to 80 Pa·s.

This silver paste is applied on the undercoat metal layers 60 of the circuit layer 12, on surfaces of the spacing members 20, and the surfaces of the lead frame 40 by screen printing or the like for example respectively and dried, so that the silver paste layers 70 are formed. It is sufficient that the silver paste layers 70 are formed on any of the planned-bonding surfaces facing to each other when bonding. In the example shown in FIG. 3C, the silver paste layers 70 are formed respectively on the surface of the circuit layer 12, the surfaces of the spacing members 20 at a side facing to the semiconductor components 30, and the surface of the lead frame 40 at a side facing to the semiconductor components 30.

As the silver paste layers 70, silver oxide paste in which oxide powder is a substitute for the silver powder can be used. The oxide silver paste contains the oxide silver powder, the reducing agent, the resin, and the solvent, and adding to these, further contains organic metal compound powder. A content of the oxide silver powder is 60% by mass to 92% by mass inclusive to the whole oxide silver paste; a content of the reducing agent is 5% by mass to 15% by mass inclusive to the whole oxide silver paste; a content of the organic metal compound powder is 0% by mass to 10% by mass inclusive to the whole oxide silver paste; and the remaining is the solvent.

——Step of Batch-Bonding——

Figure 3C:
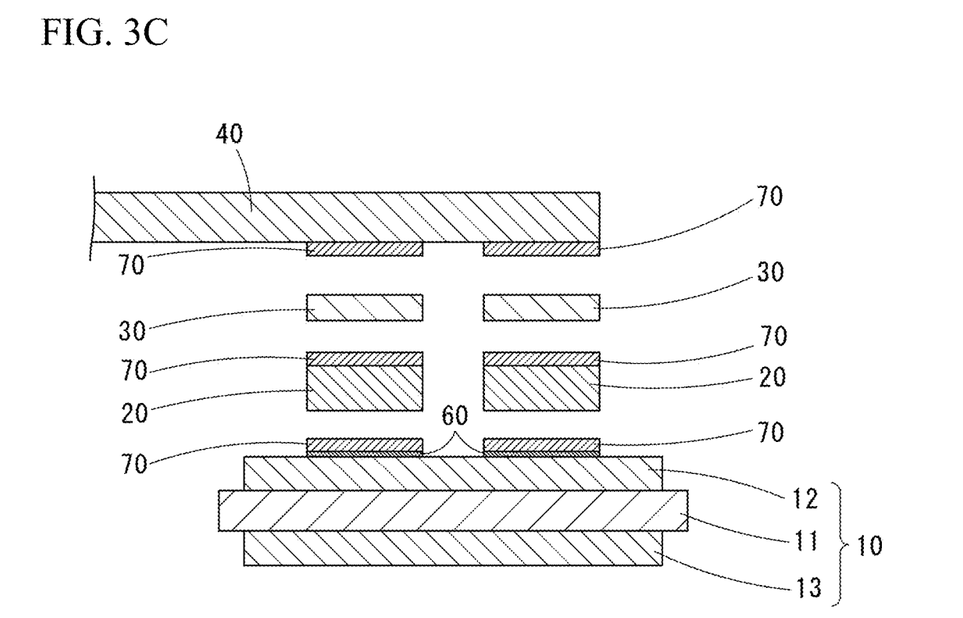
FIG. 3C It is a sectional view explaining a step of batch bonding in the manufacturing method in FIG. 2.

As shown in FIG. 3C, a laminated state is made by arranging the spacing members 20 on the silver paste layers 70 of the circuit layer 12, arranging the semiconductor components 30 on the silver paste layers 70 of the spacing members 20, and arranging the silver paste layers 70 of the lead frame 40 on the semiconductor components 30. In a state of in which a pressuring forth 1 MPa to 20 MPa inclusive is added in the laminate direction, it is heated to temperature 180° C. to 350° C. inclusive.

A holding time of this temperature is sufficient in a range 1 minute to 60 minutes inclusive. By this heat treatment, the silver paste layers 70 are sintered and form the silver-sintered bonding layers 711 to 713 respectively between the circuit layer 12, the spacing members 20, the semiconductor components 30, and the lead frame 40; and these silver-sintered bonding layers 711 to 713 bond the circuit layer 12, the spacing members 20, the semiconductor components 30, and the lead frame 40 integrally.

In a case in which the silver paste layers 70 made of the silver oxide paste containing silver oxide and the reducing agent is used, reduced silver particles precipitated by reducing the silver oxide while bonding (burning) are so minute to have a particle size 10 nm to 1 μm, for example. Thus the dense silver-sintered bonding layers 711 to 713 are formed, and it is possible to firmly bond the circuit layer 12, the spacing members 20, the semiconductor components 30, and the lead frame 40.

——Step of Resin Sealing——

As described above, after bonding the spacing members 20, the semiconductor components 30, and the lead frame 40 on the power module substrate 10; the power module substrate 10, the spacing members 20, the semiconductor components 30, and the vicinity of the connecting part of the lead frame 40 are sealed by the molding resin 50 integrally, except for the bottom surface of the heat radiation layer 13 of the power module substrate 10. Specifically, the molding resin 50 is formed by sealing material made of epoxy resin by a transfer molding method and sealing is carried out, for example.

An external end part of the lead frame 40 is exposed from the molding resin 50.

In the power module 100 manufactured as above, the warp is reduced since the semiconductor components 30 are bonded and pressed between the power module substrate having high rigidity and the lead frame 40. Therefore, the semiconductor components 30, the power module substrate 10, and the lead frame 40 can get a good bonded state without breaking the semiconductor components 30. It is facilitated to manufacture since the spacing members 20, the semiconductor components 30, and the lead frame 40 are bonded on the power module substrate 10 at one time.

In this power module 100, both the surfaces of the semiconductor components 30 are bonded on the spacing members 20 and the lead frame 40 by the first silver-sintered bonding layers 711 and the second silver-sintered bonding layers 712, so that it has high bonding reliability even under high temperature environment. The heat of the semiconductor components 30 can be quickly released since the thermal conductivity of the silver-sintered bonding layers 711 and 712 is excellent. Moreover, the spacing members 20 and the lead frame 40 arranged on both the surfaces of the semiconductor components 30 are made of the copper-type low linear-expansion material and the spacing members 20 and the lead frame 40 have small difference in the linear expansion to the semiconductor components 30, so that thermal stress on the semiconductor components 30 is reduced and the breakages thereof can be prevented.

In the power module 100, the power module substrate 10, the semiconductor components 30, and the lead frame 40 are sealed by the molding resin 50 as one assembly. Accordingly, the respective bonding states can be maintained fine by the molding resin 50; and even higher bonding reliability can be obtained.

2. Second Embodiment

Figure 5:
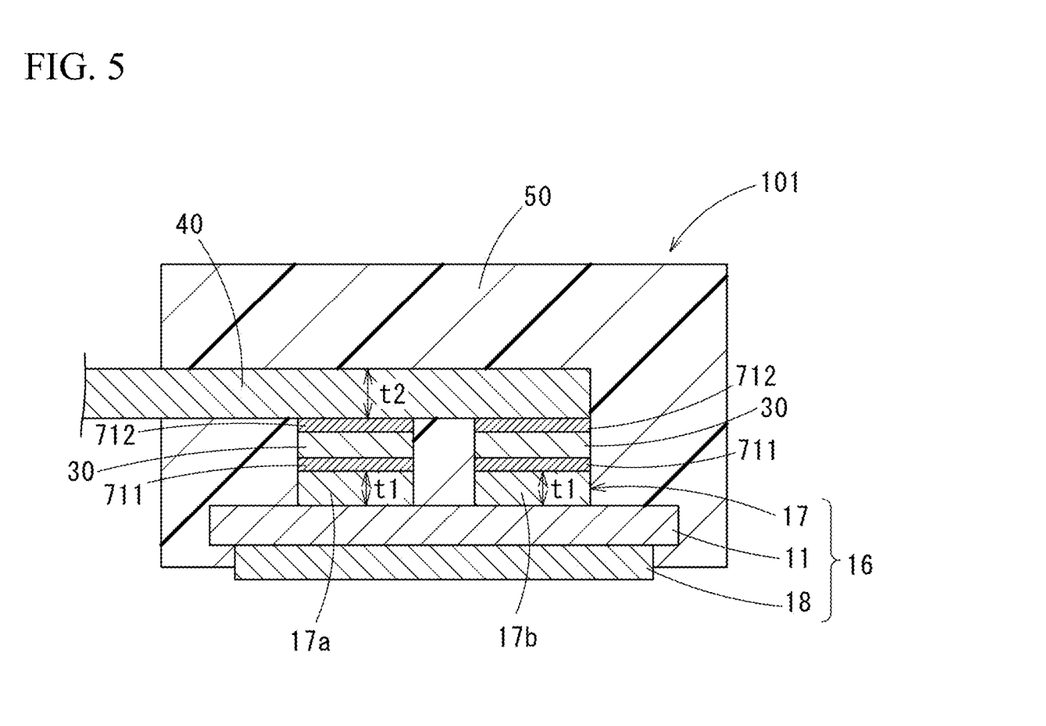
FIG. 5 It is a sectional view of a power module of a second embodiment of the present invention.

FIG. 5 shows a power module 101 of a second embodiment.

In the power module 101 of the second embodiment, there is no spacing members 20 which are provided in the first embodiment; one surface of the semiconductor components 30 is bonded on a circuit layer 17 of a power module substrate 16 with the first silver-sintered bonding layers 711 therebetween, and the lead frame 40 is bonded on the other surface of the semiconductor components 30 with the second silver-sintered bonding layers 712 therebetween.

In FIG. 5, on the ceramic substrate board 1 of the power module substrate 16, two small-circuit parts 17a and 17b as the circuit layer 17 are bonded in a laminated state aligning in a surface direction. On the small-circuit parts 17a and 17b, the first silver-sintered bonding layers 711 are bonded respectively, and the semiconductor components 30 are bonded respectively on each of the first silver-sintered bonding layers 711.

The circuit layer 17 and a heat radiation layer 18 of the power module substrate 16 are made of copper or copper alloy. Copper or copper alloy has relatively large linear expansion coefficient, however it is hard to be deformed in comparing with aluminum and the other alloy in the first embodiment. Therefore, linear expansion of the ceramic substrate board 11 is dominant over linear expansion of the circuit layer 17 at the surface. Accordingly, the whole power module substrate 16 is low linear-expansion material having smaller linear expansion coefficient than the semiconductor components 30. In the present embodiment, oxygen-free copper is used for the circuit layer 17 and the heat radiation layer 18.

The lead frame 40 is made of copper-type low linear-expansion material having a composite material and copper boards bonded on both surfaces of the composite material, as in the first embodiment. The composite material is a combination of copper (Cu) and the low linear expansion coefficient material, such as tungsten (W), molybdenum (Mo), chrome (Cr) and the other. The difference of the linear expansion coefficient between the power module substrate 16 and the lead frame 40 is set to be 5 ppm/° C. or lower. A thickness ratio (t1/t2) of a thickness t1 of the circuit layer 16 of the power module substrate 15 and a thickness t2 of the lead frame 40 is set to be 0.2 to 5.0 inclusive.

In the power module 101, the power module substrate 16 is manufactured by laminating the circuit layer 17 and the heat radiation layer 18 on the respective surfaces of the ceramic substrate board 11 with active-metal brazing material therebetween, such as silver-titanium (Ag—Ti) type brazing material or silver-copper-titanium (Ag—Cu—Ti) type brazing material; and heating to 800° C. to 930° C. inclusive in a state in which a pressure of 0.05 MPa to 1.0 MPa inclusive is added in the lamination direction, for example. After that, the circuit layer 17, the semiconductor components 30, and the lead frame 40 are laminated on respective planned-bonding surfaces with silver paste layers therebetween, and pressed and heated by batch as in the first embodiment; so that the circuit layer 12 and the semiconductor components 30 are bonded with the first silver-sintered bonding layers 711 therebetween, and the semiconductor components 30 and the lead frame 40 are bonded with the second silver-sintered bonding layers 712 therebetween. At the last, the vicinity of connection parts of the power module substrate 16 with the semiconductor components 30 and the lead frame 40 are sealed by the molding resin 50 as one assembly.

Since the circuit layer 17 of the power module substrate 16 of the present embodiment is made of copper or copper alloy, it is not necessary to provide the undercoat metal layers 60 formed on the circuit layer 12 made of aluminum or alloy thereof as in the first embodiment; however, the similar undercoat metal layers may be formed. Moreover, on the respective planned-bonding surfaces of the semiconductor components 30 and the lead frame 40, undercoat metal layers such as gold, silver, nickel, or the like may be formed by plating, spattering, or the like.

In the power module 101 manufactured as above, the lead frame 40 and the brazing material 15 arranged on both the surfaces of the semiconductor components 30 are made of copper-type low linear-expansion material having smaller linear expansion coefficient than the semiconductor components 30. Accordingly, thermal stress in the semiconductor components 30 is reduced and it is possible to effectively prevent the breakage. Since the power module substrate 16, the semiconductor components 30 which are bonded on the power module substrate 16, and the lead frame 40 are sealed by the molding resin 50 as one body, it is possible to maintain the bonding states to be good by the molding resin 50 respectively and even higher bonding reliability can be obtained.

Besides, the present invention is not limited to the above-described embodiments and various modifications may be made without departing from the scope of the present invention.

EXAMPLES

The circuit layer of the power module substrate, the spacing members, and the lead frame were prepared at the material and the thickness shown in Table 1. The silver paste was applied on any of the planned-bonding surfaces facing each other, and they were laminated and batch-bonded. In this case, regarding Invention Examples 1 to 4 and Comparative Example 1, the undercoat metal layer was formed on the surface of the circuit layer made of aluminum using the above-described glass-contained silver paste. Regarding Invention Example 5 and 6 and Comparative Example 2, the semiconductor component was bonded on the circuit layer without the spacing member. In any case, temperature was 300° C. and pressure was 10 MPa while bonding.

On the power module on which the semiconductor component was bonded, a cold/hot impact test was carried out at lower temperature −40° C. and higher temperature 150° C., with 1000 cycles, and the semiconductor was evaluated whether broken or not. The breakage of the semiconductor component was examined using an ultrasonic imaging device, and evaluated as "good" if a probability of cracks were found in the semiconductor was 10% or lower; or as "not good" if the probability of cracks were found in the semiconductor was more than 10%.

Results are shown in Table 2. In table 1, "4N—Al" is aluminum with purity 99.99% by mass or higher; "C1020" is oxygen-free copper; "Cu—Mo" is a clad material of pure copper/copper molybdenum composite material/pure copper; and "Cu—W" is a clad material of pure copper/copper tungsten composite material/pure copper.

TABLE 1

| | | POWER MODULE SUBSTRATE BOARD | | | | | | | | |
|---|---|---|---|---|---|---|---|---|---|---|
| | | | CIRCUIT LAYER | | | SPACING MEMBER | | | LEAD FRAME | |
| | | LINEAR EXPANSION COEFFICIENT | MATERIAL | THICKNESS t1 | LINEAR EXPANSION COEFFICIENT | MATERIAL | THICKNESS t3 | LINEAR EXPANSION COEFFICIENT | MATERIAL | THICKNESS t2 |
| INVENTION EXAMPLE | 1 | | 4N—Al | | 10 ppm/° C. | Cu—Mo | 1 mm | 10 ppm/° C. | Cu—Mo | 1 mm |
| | 2 | | 4N—Al | | 10 ppm/° C. | Cu—Mo | 2 mm | 10 ppm/° C. | Cu—Mo | 1 mm |
| | 3 | | 4N—Al | | 10 ppm/° C. | Cu—Mo | 4 mm | 10 ppm/° C. | Cu—Mo | 1 mm |
| | 4 | | 4N—Al | | 10 ppm/° C. | Cu—Mo | 1 mm | 8 ppm/° C. | Cu—W | 1 mm |
| | 5 | 10 ppm/° C. | C1020 | 1 mm | — | NONE | — | 10 ppm/° C. | Cu—Mo | 1 mm |
| | 6 | 10 ppm/° C. | C1020 | 1 mm | — | NONE | — | 10 ppm/° C. | Cu—Mo | 2 mm |
| COMPARATIVE EXAMPLE | 1 | | 4N—Al | | 17 ppm/° C. | C1020 | 1 mm | 10 ppm/° C. | Cu—Mo | 1 mm |
| | 2 | 5 ppm/° C. | 4N—Al | 1 mm | — | NONE | — | 17 ppm/° C. | C1020 | 1 mm |

TABLE 2

|  |  | RATIO (t1/t2) | RATIO (t3/t2) | BREAKAGE OF COMPONENT |
|---|---|---|---|---|
| INVENTION EXAMPLE | 1 |  | 1 | GOOD |
|  | 2 |  | 2 | GOOD |
|  | 3 |  | 4 | GOOD |
|  | 4 |  | 1 | GOOD |
|  | 5 | 1 |  | GOOD |
|  | 6 | 0.5 |  | GOOD |
| COMPARATIVE EXAMPLE | 1 |  | 1 | NOT GOOD |
|  | 2 | 1 |  | NOT GOOD |

As recognized from Tables 1 and 2, the breakage of the semiconductor component was not found in the power modules in which the difference of the linear expansion coefficient between materials on both the surfaces of the semiconductor component was not more than 5 ppm/° C., and the thickness ratio (t1/t2) or the ratio (t3/t2) was 0.2 to 5.0 inclusive.

INDUSTRIAL APPLICABILITY

By bonding the low linear-expansion material having lower linear expansion coefficient than the electronic component on both the surfaces of the electronic component with the silver-sintered bonding layers therebetween and reducing the difference of the linear expansion between the low linear-expansion material, it is possible to improve the bonding reliability and the thermal transference of the electronic-component-mounted module, and it is possible to reduce the thermal stress in the electronic component and prevent the breakage thereof.

REFERENCE SIGNS LIST

10 Power module substrate (Insulation circuit substrate board)
11 Ceramic substrate board
12 Circuit board
13 Heat radiation layer
15 Brazing material
16 Power module substrate (Copper-type low linear expansion coefficient material, Insulation circuit layer)
17 Circuit layer
17a, 17b Small-circuit part
18 Heat radiation layer
20 Spacing member (Copper-type low linear-expansion material)
30 Semiconductor component (Electronic component)
40 Lead frame (Copper-type low linear-expansion material)
50 Molding resin
60 Undercoat metal layer
61 Glass layer
62 Silver layer
70 Silver paste layer
711 First silver-sintered bonding layer
712 Second silver-sintered bonding layer
713 Third silver-sintered bonding layer
100, 101 Power module (Electronic-component-mounted module)

The invention claimed is:

1. Electronic-component-mounted module comprising:
an electronic component;
a first silver-sintered bonding layer bonded on one surface of the electronic component;
an insulation circuit substrate board comprising a circuit layer made of copper or copper alloy bonded on the first silver-sintered bonding layer and a ceramic substrate board bonded on the circuit layer, and having a smaller linear expansion coefficient than the electronic component;
a second silver-sintered bonding layer bonded on a second surface opposite the one surface of the electronic component;
a lead frame bonded on the second silver-sintered bonding layer and having a smaller linear expansion coefficient than the electronic component, wherein a difference in the linear expansion coefficient to the insulation circuit substrate board is not more than 5 ppm/° C.;
wherein a thickness of the circuit layer is t1; a thickness of the lead frame is t2; and a thickness ratio of the thickness t1 and the thickness t2 is not less than 1.0 and not more than 5.0; and
wherein undercoat metal layers are formed on the circuit layer, wherein the undercoat metal layers have a double structure of a glass layer formed on the surface of the circuit layer and a silver layer formed on the glass layer.

2. The electronic-component-mounted module according to claim 1, wherein the lead frame is made of copper-type low linear-expansion material comprising
a composite material which is a combination of copper and a low linear-expansion material; and
copper boards bonded on both surfaces of the composite material.

3. The electronic-component-mounted module according to claim 1, further comprising molding resin sealing the insulation circuit substrate board, the electronic component, and the lead frame integrally.

4. An electronic-component-mounted module comprising:
an electronic component;
a first silver-sintered bonding layer bonded on one surface of the electronic component;
an insulation circuit substrate board having: a spacing member with smaller linear expansion coefficient than the electronic component bonded on the first silver-sintered bonding layer, a third silver-sintered bonding layer bonded on the spacing member, a circuit layer made of aluminum or aluminum alloy and bonded on the third silver-sintered bonding layer, and a ceramic substrate board bonded on the circuit layer;
a second silver-sintered bonding layer bonded on a second surface opposite the one surface of the electronic component;
a lead frame bonded on the second silver-sintered bonding layer and having smaller linear-expansion coefficient than the electronic component, wherein a difference in the linear expansion coefficient to the spacing member is not more than 5 ppm/° C.;
wherein a thickness of the spacing member is t3, a thickness of the lead frame is t2, and a thickness ratio (t3/t2) of the thickness t3 and the thickness t2 is not less than 1.0 and not more than 5.0; and
wherein undercoat metal layers are formed on the circuit layer, wherein the undercoat metal layers have a double structure of a glass layer formed on the surface of the circuit layer and a silver layer formed on the glass layer.

5. The electronic-component-mounted module according to claim 4, wherein the spacing member and the lead frame are made of copper-type low linear-expansion material comprising a composite material which is a combination of copper and a low linear-expansion material, and copper boards bonded on both surfaces of the composite material.

6. The electronic-component-mounted module according to claim 4, further comprising molding resin sealing the insulation circuit substrate board, the electronic component, and the lead frame integrally.

* * * * *